US009871346B1

(12) United States Patent
Lee et al.

(10) Patent No.: US 9,871,346 B1
(45) Date of Patent: Jan. 16, 2018

(54) MODE-HOP-FREE HYBRID EXTERNAL-CAVITY LASER WITH PASSIVE THERMO-OPTIC COEFFICIENT COMPENSATION (71) Applicant: Oracle International Corporation, Redwood Shores, CA (US)

(72) Inventors: Jin-Hyoung Lee, San Diego, CA (US); Xuezhe Zheng, San Diego, CA (US); Ivan Shubin, San Diego, CA (US); Jock T. Bovington, La Jolla, CA (US); Ashok V. Krishnamoorthy, San Diego, CA (US)

(73) Assignee: Oracle International Corporation, Redwood Shores, CA (US)

( * ) Notice: Subject to any disclaimer, the term of this patent is extended or adjusted under 35 U.S.C. 154(b) by 0 days.

(21) Appl. No.: 15/425,889

(22) Filed: Feb. 6, 2017

Related U.S. Application Data (60) Provisional application No. 62/398,397, filed on Sep. 22, 2016.

(51) Int. Cl.
*H01S 5/00* (2006.01)
*H01S 5/065* (2006.01)
(Continued)

(52) U.S. Cl.
CPC ............ *H01S 5/0651* (2013.01); *H01S 3/105* (2013.01); *H01S 5/021* (2013.01); *H01S 5/026* (2013.01);
(Continued)

(58) Field of Classification Search
CPC ...... H01S 5/0651; H01S 5/026; H01S 5/1028; H01S 5/125; H01S 5/14; H01S 5/3013;
(Continued)

(56) References Cited

U.S. PATENT DOCUMENTS 4,993,032 A 2/1991 Bradley
5,043,991 A 8/1991 Bradley
(Continued)

OTHER PUBLICATIONS

Bovington et al.; "Athermal laser design," Opt. Express, vol. 22, No. 16, pp. 19357-19364, Aug. 2014.
(Continued)

*Primary Examiner* — Kinam Park
(74) *Attorney, Agent, or Firm* — Park, Vaughan, Fleming & Dowler LLP (57) ABSTRACT

The disclosed embodiments relate to a system that implements a hybrid laser. This system includes a reflective gain medium (RGM) comprising an optical gain material coupled to a mirror. This RGM is coupled to a spot-size converter (SSC), which optically couples the RGM to an optical reflector through a silicon waveguide. The SSC converts an optical mode-field size of the RGM to an optical mode-field size of the silicon waveguide. During operation, the RGM, the spot-size converter, the silicon waveguide and the silicon mirror collectively form a lasing cavity, wherein an effective thermo-optic coefficient (TOC) of a portion of the lasing cavity that passes through the optical gain material and the SSC material is substantially the same as the TOC of silicon. Finally, a laser output is optically coupled out of the lasing cavity.

20 Claims, 5 Drawing Sheets
(3 of 5 Drawing Sheet(s) Filed in Color)

(51) Int. Cl.
*H01S 5/30* (2006.01)
*H01S 5/125* (2006.01)
*H01S 5/026* (2006.01)
*H01S 5/10* (2006.01)
*H01S 5/14* (2006.01)
*H01S 3/105* (2006.01)
*H01S 5/068* (2006.01)
*H01S 5/02* (2006.01)
*H01S 5/024* (2006.01)
*H01S 5/0687* (2006.01)

(52) U.S. Cl.
CPC ........ *H01S 5/02453* (2013.01); *H01S 5/0687* (2013.01); *H01S 5/06817* (2013.01); *H01S 5/1028* (2013.01); *H01S 5/1092* (2013.01); *H01S 5/125* (2013.01); *H01S 5/14* (2013.01); *H01S 5/3013* (2013.01); *H01S 5/1025* (2013.01)

(58) Field of Classification Search
CPC .. H01S 5/021; H01S 5/02453; H01S 5/06817; H01S 5/0687; H01S 5/1092; H01S 5/1025
See application file for complete search history.

(56) References Cited

U.S. PATENT DOCUMENTS

| | | | |
|---|---|---|---|
| 6,341,138 | B1 | 1/2002 | Peters |
| 8,988,770 | B2 | 3/2015 | Zheng et al. |
| 9,257,814 | B1* | 2/2016 | Djordjevic ............... G02B 6/26 |
| 9,373,934 | B2 | 6/2016 | Lin et al. |
| 9,762,034 | B2* | 9/2017 | Takabayashi ............ H01S 5/50 |
| 2005/0018741 | A1 | 1/2005 | Nomaguchi |
| 2015/0303653 | A1* | 10/2015 | Tanaka ................. G02B 6/1228 |
| | | | 398/200 |
| 2016/0170141 | A1 | 6/2016 | Luo et al. |

OTHER PUBLICATIONS

Cohen et al.; "Reduced temperature sensitivity of the wavelength of a diode laser in a stress-engineered hydrostatic package," Appl. Phys. Lett., vol. 69, No. 4, p. 455, 1996.

Fleming et al.; "Spectral Characteristics of External-Cavity Controlled Semiconductor Lasers," IEEE J. Quantum Electron., vol. 17, No. 1, pp. 44-59, 1981.

Bosc et al.; Temperature and polarisation insensitive Bragg gratings realised on silica waveguide on silicon, Electronics Letters, vol. 33, No. 2, Jan. 1997.

Liu et al.; "Condition for the realization of a temperature-insensitive long-period waveguide grating", Optics Letters, vol. 31, pp. 2716-2718, No. 18, Sep. 15, 2006.

* cited by examiner

MODE-HOP-FREE HYBRID EXTERNAL-CAVITY LASER WITH PASSIVE THERMO-OPTIC COEFFICIENT COMPENSATION

RELATED APPLICATIONS

This application claims priority under 35 U.S.C. §119 to U.S. Provisional Patent Application No. 62/398,397, entitled "Passive Laser Stabilization by Thermo-Optic Compensation of an III-V/Si Hybrid Laser Cavity" by the same inventors as the instant application, filed on 22 Sep. 2016, the contents of which are incorporated herein by reference. This application is also related to U.S. patent application Ser. No. 15/405,209 entitled "Thermally Compensating Spot-Size Converter for an Athermal Laser" by inventors Jock T. Bovington, et al., filed on 12 Jan. 2017, the contents of which are also incorporated herein by reference. Application Ser. No. 15/405,209 claims priority under 35 U.S.C. §119 to U.S. Provisional Application No. 62/398,366, entitled "Thermally Compensating Spot-Size Converter in Athermal Laser," by inventors Jock T. Bovington et al., filed 22 Sep. 2016, the contents of which are herein incorporated by reference in their entirety.

GOVERNMENT LICENSE RIGHTS

This invention was made with U.S. government support under Agreement No. HR0011-08-9-0001 awarded by DARPA. The U.S. government has certain rights in the invention.

FIELD

The disclosed embodiments generally relate to the design of optoelectronic circuits. More specifically, the disclosed embodiments relate to the design of a mode-hop-free hybrid external-cavity laser with passive thermo-optic coefficient compensation.

RELATED ART

Silicon photonics is a promising new technology that can potentially provide large communication bandwidth, low latency and low power consumption for inter-chip and intra-chip connections. At present, silicon photonic technology is in its early stages of commercialization in the high-speed interconnect market, wherein it is used to facilitate communications within data centers and high-performance computing systems. Wide-scale adoption of silicon photonic technology will largely depend on continuing improvements in the cost-effectiveness and energy efficiency of silicon photonic platforms. To this end, researchers have developed on-chip silicon photonic light sources using III-V/Si hybrid lasers to provide improved energy efficiency and manufacturability. (See [Zheng2016] X. Zheng, et al., "III-V/Si Hybrid Laser Arrays using Back End of the Line (BEOL) Integration," IEEE J. Sel. Top. Quant., PP (99), 2016. Also, see [Lee2015] J.-H. Lee, et al., "Demonstration of 12.2% wall plug efficiency in uncooled single mode external-cavity tunable Si/III-V hybrid laser," Opt. Express, 23(9), 12079-12088, 2015.)

Unfortunately, "mode-hopping" is often observed in such III-V hybrid lasers and is believed to be caused by differences in the thermal-optic properties of the heterogeneous materials comprising the hybrid laser cavity. This mode-hopping creates unwanted intensity noise, which is detrimental to a high-speed optical data link. It is therefore typically necessary for such hybrid lasers to be stabilized by using an external control system to facilitate mode-hop-free operation. For example, researchers have demonstrated an integrated III-V/Si hybrid laser with a feedback-control system that achieves mode-hop-free operation by performing real-time, closed-loop wavelength control of a micro-ring resonator. (See [Lee2016] J.-H. Lee, et al., "III-V/Si hybrid laser stabilization using micro-ring feedback control," IEEE Photon. J., 8(5), 1-7, 2016.) However, such stabilization approaches require additional control circuitry, which could adversely affect the footprint of the transmitter system and its energy consumption.

Hence, what is needed is a hybrid laser that does not suffer from the above-described drawbacks of existing hybrid lasers.

SUMMARY

The disclosed embodiments relate to a system that implements a hybrid laser. This system includes a reflective gain medium (RGM) comprising an optical gain material coupled to a mirror. This RGM is coupled to a spot-size converter (SSC), which converts an optical mode-field size of the RGM to an optical mode-field size of a silicon waveguide. This SSC optically couples the RGM to an optical reflector through the silicon waveguide. During operation, the RGM, the spot-size converter, the silicon waveguide and the silicon mirror collectively form a lasing cavity, wherein an effective thermo-optic coefficient (TOC) of a portion of the lasing cavity that passes through the optical gain material and the SSC material is substantially the same as the TOC of silicon. Finally, a laser output is optically coupled out of the lasing cavity.

In some embodiments, the lasing cavity includes a length $l_{Si}$ through silicon, a length $l_{SSC}$ through the SSC material and a length $l_{OGM}$ through the optical gain material, wherein the effective refractive index of silicon is $n_{Si}$, the effective refractive index of the SSC material is $n_{SSC}$, and the effective refractive index of the optical gain material is $n_{OGM}$. Moreover, the effective thermo-optic coefficient (TOC) of silicon is $dn_{Si}/dT$, the effective TOC of the SSC material is $dn_{SSC}/dT$, and the effective TOC of the optical gain material is $dn_{OGM}/dT$. Finally, $l_{SSC} \approx l_{OGM}*(dn_{OGM}/dT - dn_{Si}/dT)/(dn_{Si}/dT - dn_{SSC}/dT)$, whereby the effective TOC of the portion of the lasing cavity that passes through the optical gain material and the SSC material is substantially the same as the TOC of silicon.

In some embodiments, the silicon mirror comprises a micro-ring mirror.

In some embodiments, the silicon mirror comprises a distributed Bragg reflector (DBR).

In some embodiments, the silicon mirror is a tunable silicon mirror, which includes a thermal-tuning mechanism.

In some embodiments, the RGM is located on a gain chip, which is separate from a silicon photonic chip, which includes the silicon waveguide and the silicon mirror.

In some embodiments, the spot-size converter is comprised of silicon oxynitride (SiON), where the nitrogen-to-oxygen ratio may vary.

In some embodiments, the spot-size converter is comprised of stoichiometric or low-stress silicon nitride (SiNx).

In some embodiments, the optical gain material comprises a III-V semiconductor.

BRIEF DESCRIPTION OF THE FIGURES

The patent or application file contains at least one drawing executed in color. Copies of this patent or patent application

DETAILED DESCRIPTION

The following description is presented to enable any person skilled in the art to make and use the present embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present embodiments. Thus, the present embodiments are not limited to the embodiments shown, but are to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

Throughout this specification, and in the appended claims, we use the term "gain medium" (GM) to refer to any device that contains active gain material and can be used to power a laser. This can include, but is not limited to: a semiconductor optical amplifier (SOA), an active device fabricated using a quantum-dot gain material, and an active device fabricated in a nonlinear fiber gain medium. We also use the term "reflective gain medium" (RGM) to refer to any type of active gain material, which is coupled to an associated reflector. This can include, but is not limited to: a reflective semiconductor optical amplifier (RSOA), and an SOA that can be accessed through both ends and looped either as: (1) a loop mirror coupled to a reflective end of the SOA, or (2) a loop containing the SOA before the SOA. (This geometry changes the structure to the extent that light passes in a single pass through both directions in the SOA, just like a double pass through an RSOA, and provides gain.) Note that the loop mirror recited above can alternatively be replaced with a distributed Bragg reflector (DBR).

Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Overview

We present a new approach to stabilize a III-V/Si hybrid external-cavity laser over temperature variations without using an active-feedback control system. By designing the respective lengths of the different cavity sections in accordance with their specific thermo-optic properties, it is possible to synchronize the cavity-mode drift with the filter wavelength drift in a completely passive manner and, consequently, to achieve mode-hop-free operation. Using such principles, we empirically demonstrate an on-chip hybrid laser that maintains mode-hop-free operation over a temperature range of 35° C.

Details

Figure 1A:
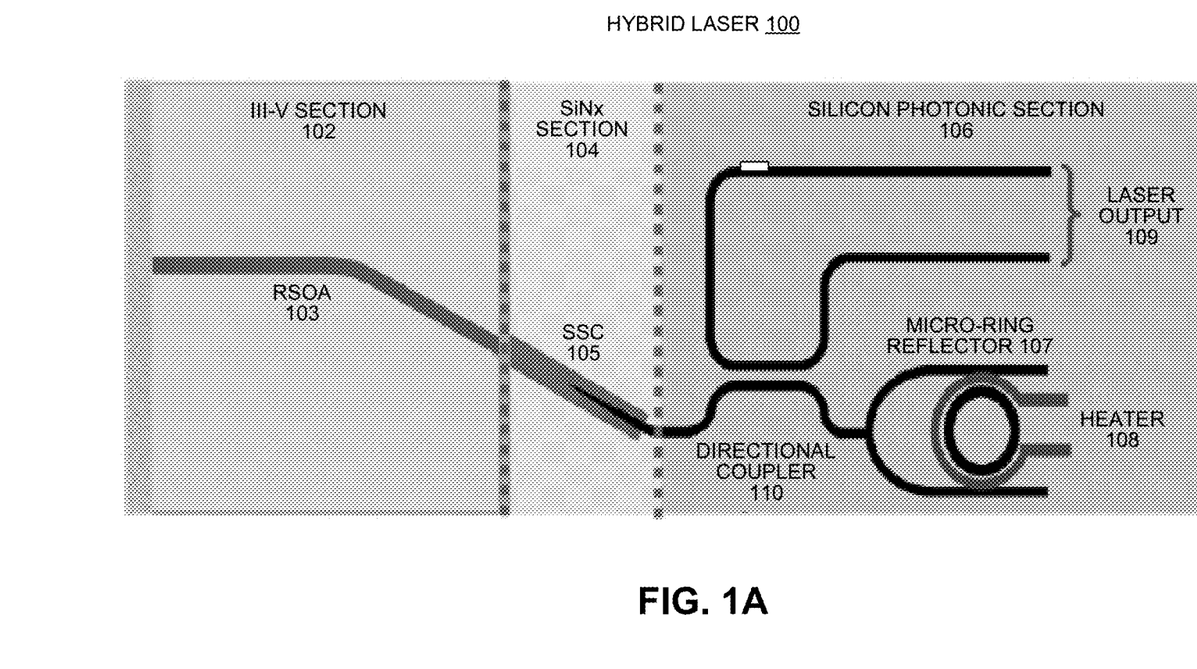
FIG. 1A illustrates an exemplary hybrid external-cavity laser in accordance with the disclosed embodiments.

Referring to FIG. 1A, our new III-V/Si hybrid laser is composed of three sections: (1) a III-V section 102 with an RSOA 103 for light generation; (2) a silicon photonic section 106 including a micro-ring reflector 107 with a heater 108 for wavelength filtering/tuning; and (3) a SiNx section 104 including a SSC 105 for low-loss coupling between RSOA 103 and the silicon reflector in the form of a micro-ring reflector 107. Silicon photonic section 106 also includes a directional coupler 110, which is coupled to a laser output 109.

Figure 1B:
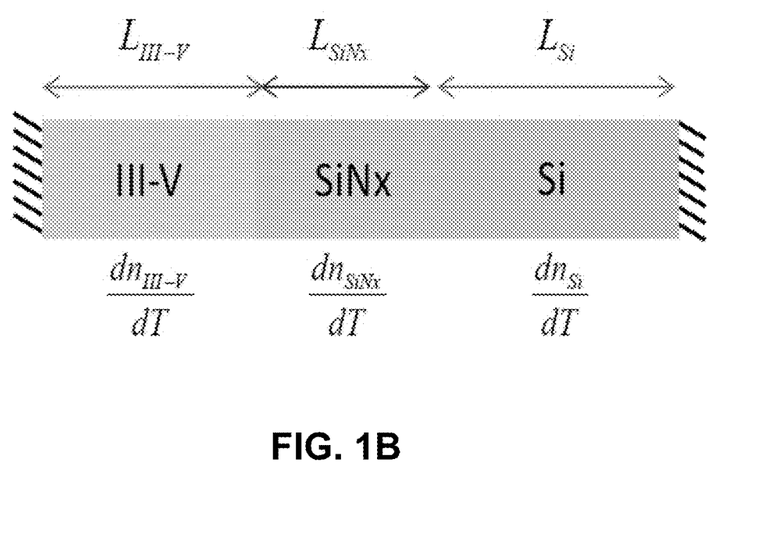
FIG. 1B illustrates the hybrid cavity structure with corresponding TOCs and lengths in accordance with the disclosed embodiments.

Each of these sections has a different thermo-optic coefficient (TOC) as illustrated in FIG. 1B. Moreover, an effective TOC of the total laser cavity can be estimated as an average of each section's TOC weighted by its filling factor (a ratio of the section length to the total cavity length) as expressed in equation (1) below.

$$\frac{d\bar{n}_{cavity}}{dT} \cong \frac{L_{III-V}}{L_{cavity}}\frac{d\bar{n}_{III-V}}{dT} + \frac{L_{SiNx}}{L_{cavity}}\frac{d\bar{n}_{SiNx}}{dT} + \frac{L_{Si}}{L_{cavity}}\frac{d\bar{n}_{Si}}{dT} \quad (1)$$

Equation (1) is a first-order approximation neglecting thermal expansion and dispersion, wherein $\bar{n}_{III-V}$, $\bar{n}_{SiNx}$ and $\bar{n}_{Si}$ represent effective indices of waveguides in the III-V section, the silicon photonic section and the $SiN_x$ section, respectively. Given the different TOCs of III-V, silicon and $SiN_x$, it is possible to engineer the effective TOC of the laser cavity by properly tailoring the lengths of the different sections. The goal of this cavity design is to compensate for the higher TOC of the III-V gain section ($d\bar{n}_{III-V}/dT \sim 2.4 \sim 10\text{-}4[1/K]$) through the lower TOC of the SiNx SSC section ($d\bar{n}_{SiNx}/dT \sim 2.5 \sim 10\text{-}5[1/K]$) so that the effective cavity TOC ($d\bar{n}_{cavity}/dT$) can match the Si TOC (d $\bar{n}_{Si}/dT \sim 1.86 \sim 10\text{-}4[1/K]$). With such a TOC-engineered hybrid laser cavity, a relative spectral alignment between the lasing cavity mode and the ring resonance can be maintained during temperature variations, which in turn effectively facilitates stable laser operation during temperature changes without mode-hopping.

In an exemplary embodiment, the RSOA active section length is 300 μm, while the total silicon photonic section length is 500 μm. To balance the cavity's effective TOC, the SiNx section length was designed to be 100 μm based on calculations using the TOC values listed above. Because the SiNx SSC section is composed of a Si/SiNx hybrid section (a Si inverse taper) and a SiNx only section, we ran a mode-confinement simulation across the length of the entire SiNx SSC to estimate the effective $SiN_x$ length. In this design, the $SiN_x$ only section is 50 μm in length and the Si/$SiN_x$ hybrid section is 200 μm in length.

Proof of Concept

A proof-of-concept demonstration was implemented in an integrated III-V/Si hybrid laser in which an RSOA and a silicon photonic chip are flip-chip bonded to a common Si interposer with AuSn bumps. Note that the Si interposer serves as a micro-bench for optical mode alignment using micro-machined spacers, and also an electrical/thermal interface for the hybrid laser. Details of this laser integration process are disclosed in [Zheng2016]. The RSOA chip incorporates a built-in SSC, which expands the mode to a 3×3 μm mode field diameter to match the SiNx SSC on the silicon photonic chip. The micro-ring resonator on silicon photonic chip is designed with a radius of 2.5 μm (corresponding to a ring FSR of 37 nm) to minimize potential ring FSR mode-hopping. A metal-heater is integrated on top of the ring for efficient wavelength tuning.

Figure 2:
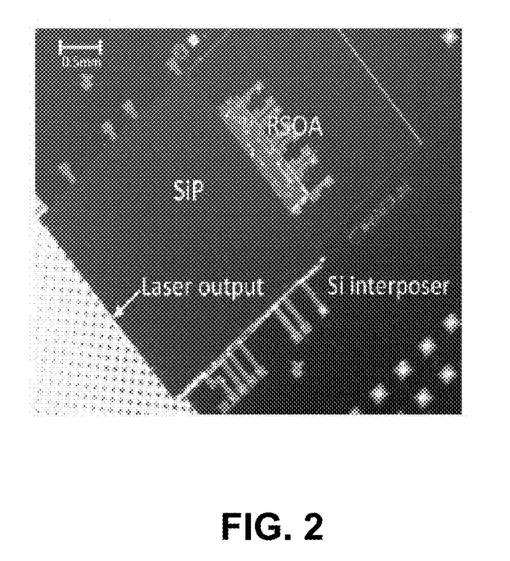
FIG. 2 presents a photograph of an exemplary III-V/Si hybrid laser in accordance with the disclosed embodiments.
Figure 3A:
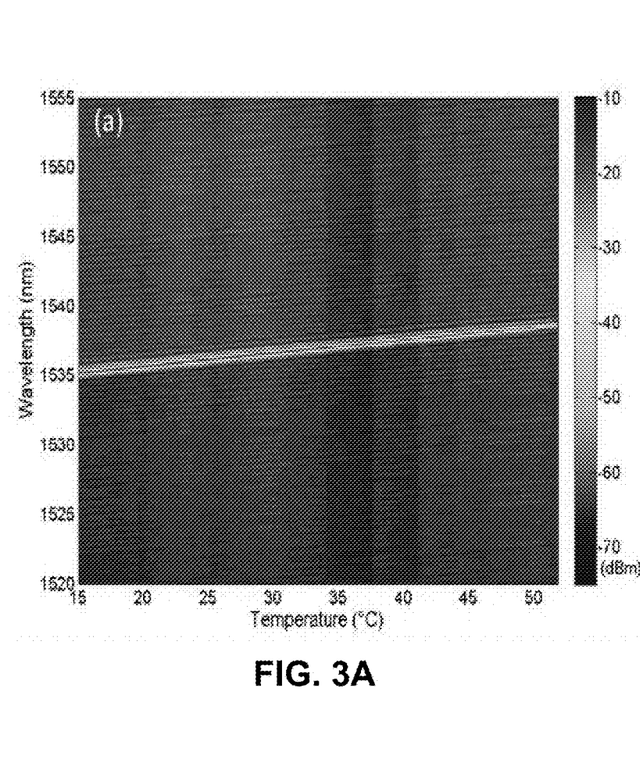
FIG. 3A illustrates hybrid laser spectrum data over a temperature sweep from 15° C. to 50° C. with the hybrid laser biased at 60 mA in accordance with the disclosed embodiments.
Figure 3B:
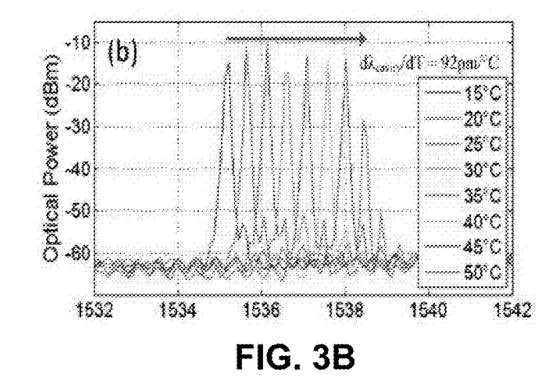
FIG. 3B illustrates overlapped individual laser spectra for different temperatures with ΔT=5° C. and the estimated lasing cavity mode drift rate in accordance with the disclosed embodiments.
Figure 3C:
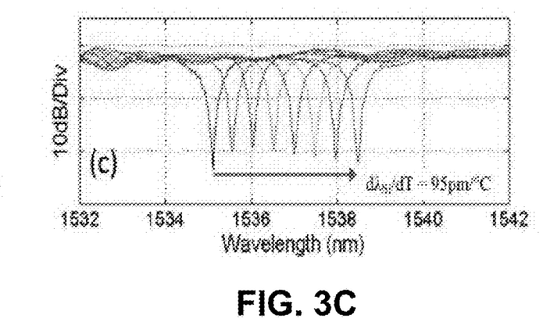
FIG. 3C illustrates the micro-ring through-port spectra with ΔT=5° C. and the estimated ring resonance drift rate in accordance with the disclosed embodiments.

FIG. 2 presents a photograph of the III-V/Si hybrid laser in this proof-of-concept implementation, wherein the silicon photonic and RSOA chips are flip-chip bonded on the Si interposer. Electrical pads for RSOA driving and the silicon micro-ring tuning are located on the silicon interposer. This integrated hybrid laser is mounted on a copper block with an integrated TEC control unit. Laser driving current is supplied through metal traces on the interposer to the III-V RSOA via AuSn bumps. As illustrated in FIG. 2, electrical pads for the micro-ring heater are also provisioned on the interposer. This integrated laser implementation exhibits a threshold current of 13 mA and a maximum waveguide-coupled output power of ~4 mW (100 mA) at room temperature. Also, the laser line width is ~50 kHz as measured by a self-homodyne technique described in [Zhang 2016]. In this proof-of-concept demonstration, the laser was biased at a constant current (60 mA) and the temperature of the thermoelectric cooler (TEC) was swept from 15° C. to 50° C. while the laser spectrum was continuously monitored by an optical spectrum analyzer (OSA). At 15° C., the lasing wavelength was 1535.2 nm and the metal heater on the micro-ring resonator was slightly adjusted to optimize the ring resonance alignment with the lasing cavity mode. As the temperature was elevated, the lasing cavity mode was red-shifted due to the thermo-optic effect. While the temperature was increased to 50° C., the cavity mode was shifted by 3.2 nm as shown in FIG. 3B, wherein FIG. 3B illustrates overlapped individual laser spectra for different temperatures with $\Delta T=5°$ C. and the estimated lasing cavity mode drift rate ($d\lambda_{cavity}/dT=92$ μm/° C.). During the entire 35° C. temperature sweep, no mode-hopping occurred and the lasing cavity mode remained unchanged. (See FIG. 3A, which illustrates laser spectrum data over a temperature sweep from 15° C. to 50° C., wherein the laser is biased at 60 mA.) We also independently characterized the micro-ring resonance drift by temperature as presented in FIG. 3C, which illustrates the micro-ring through-port spectra with $\Delta T=5°$ C. and the estimated ring resonance drift rate. The micro-ring resonance drift rate ($d\lambda_{Si}/dT$) was measured to be 95 pm/° C., which nearly matches the lasing cavity mode drift rate. These results indicate that our cavity design was able to effectively compensate for the TOC mismatch among the III-V, RSOA and silicon sections. However, an inherent temperature dependence of the RSOA gain section significantly degraded the laser performance at higher temperatures, and the hybrid laser eventually ceased operating above 50° C. Nevertheless, this demonstration implementation proves that the passive TOC compensation method can effectively eliminate mode-hopping during temperature variations for an external-cavity III-V/Si hybrid laser. Note that this approach obviates the need to design and implement a complex active temperature-control system while achieving stable laser operation with zero-power consumption.

Operation

Figure 4:
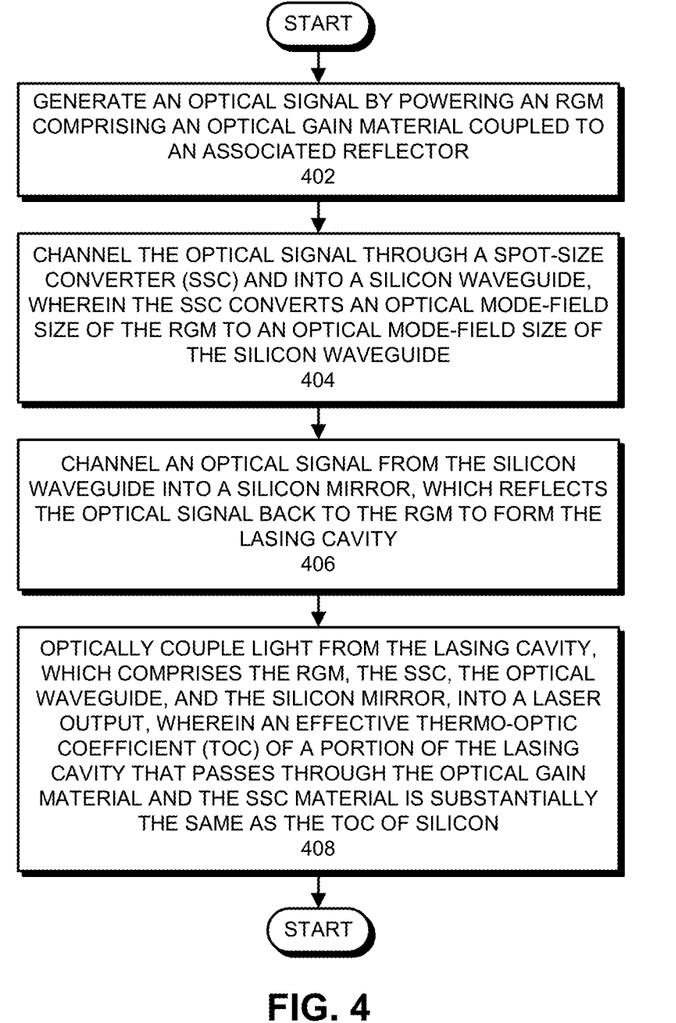
FIG. 4 presents a flow chart describing operation of an exemplary hybrid laser in accordance with the disclosed embodiments.

During operation, the hybrid laser system described above operates as illustrated in the flow chart that appears in FIG. 4. The system first generates an optical signal by powering a reflective gain medium (RGM) comprising an optical gain material coupled to an associated reflector (step 402). Next, the system channels the optical signal through a spot-size converter (SSC) into a silicon waveguide, wherein the SSC converts an optical mode-field size of the RGM to an optical mode-field size of the silicon waveguide (step 404). The system then channels the optical signal from the silicon waveguide into a silicon mirror, which reflects the optical signal back to the RGM to form the lasing cavity (step 406). Finally, the system optically couples light from the lasing cavity, which comprises the RGM, the SSC, the optical waveguide, and the silicon mirror, into a laser output, wherein an effective thermo-optic coefficient (TOC) of a portion of the lasing cavity that passes through the optical gain material and the SSC material is substantially the same as the TOC of silicon (step 408).

System

Figure 5:
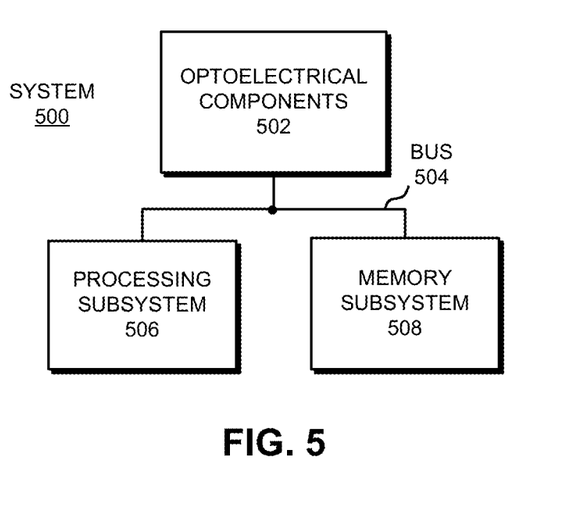
FIG. 5 illustrates a system that incorporates optical components with semiconductor chips in accordance with an embodiment of the present disclosure.

One or more of the preceding embodiments may be included in a system or device. More specifically, FIG. 5 illustrates a system 500 that includes optoelectrical components 502 including one or more hybrid lasers. System 500 also includes a processing subsystem 506 (with one or more processors) and a memory subsystem 508 (with memory).

In general, system 500 may be implemented using a combination of hardware and/or software. Thus, system 500 may include one or more program modules or sets of instructions stored in a memory subsystem 508 (such as DRAM or another type of volatile or non-volatile computer-readable memory), which, during operation, may be executed by processing subsystem 506. Furthermore, instructions in the various modules in memory subsystem 508 may be implemented in: a high-level procedural language, an object-oriented programming language, and/or in an assembly or machine language. Note that the programming language may be compiled or interpreted, e.g., configurable or configured, to be executed by the processing subsystem.

Components in system 500 may be coupled by signal lines, links or buses, for example bus 504. These connections may include electrical, optical, or electro-optical communication of signals and/or data. Furthermore, in the preceding embodiments, some components are shown directly connected to one another, while others are shown connected via intermediate components. In each instance, the method of interconnection, or "coupling," establishes some desired communication among two or more circuit nodes, or terminals. Such coupling may often be accomplished using a number of photonic or circuit configurations, as will be understood by those of skill in the art; for example, photonic coupling, AC coupling and/or DC coupling may be used.

In some embodiments, functionality in these circuits, components and devices may be implemented in one or more: application-specific integrated circuits (ASICs), field-programmable gate arrays (FPGAs), and/or one or more digital signal processors (DSPs). Furthermore, functionality in the preceding embodiments may be implemented more in hardware and less in software, or less in hardware and more in software, as is known in the art. In general, system 500 may be at one location or may be distributed over multiple, geographically dispersed locations.

System 500 may include: a switch, a hub, a bridge, a router, a communication system (such as a wavelength-division-multiplexing communication system), a storage area network, a data center, a network (such as a local area network), and/or a computer system (such as a multiple-core processor computer system). Furthermore, the computer system may include, but is not limited to: a server (such as a multi-socket, multi-rack server), a laptop computer, a communication device or system, a personal computer, a work station, a mainframe computer, a blade, an enterprise computer, a data center, a tablet computer, a supercomputer, a network-attached-storage (NAS) system, a storage-area-network (SAN) system, a media player (such as an MP3 player), an appliance, a subnotebook/netbook, a tablet computer, a smartphone, a cellular telephone, a network appliance, a set-top box, a personal digital assistant (PDA), a toy, a controller, a digital signal processor, a game console, a device controller, a computational engine within an appliance, a consumer-electronic device, a portable computing device or a portable electronic device, a personal organizer, and/or another electronic device.

Moreover, the optoelectrical components 502 can be used in a wide variety of applications, such as: communications (for example, in a transceiver, an optical interconnect or an optical link, such as for intra-chip or inter-chip communication), a radio-frequency filter, a bio-sensor, data storage (such as an optical-storage device or system), medicine (such as a diagnostic technique or surgery), a barcode scanner, metrology (such as precision measurements of distance), manufacturing (cutting or welding), a lithographic process, data storage (such as an optical-storage device or system) and/or entertainment (a laser light show).

CONCLUSION

Laser stabilization in III-V/Si hybrid lasers is critical to high speed/density silicon photonic links and their commercialization efforts. We propose a novel technique to enable mode-hop-free laser operation over temperature variations by using a passive cavity design to compensate for the TOC mismatch. The effective cavity TOC is engineered by adjusting the different sections' lengths according to their corresponding TOCs. In an experimental demonstration, we fabricated a hybrid cavity with an effective TOC close to that of silicon so that the cavity mode drifts at the same rate as the wavelength of the micro-ring filter. We successfully demonstrated single-mode and mode-hop-free laser operation over a 35° C. temperature range without active feedback controls consuming no additional power.

The foregoing descriptions of embodiments have been presented for purposes of illustration and description only. They are not intended to be exhaustive or to limit the present description to the forms disclosed. Accordingly, many modifications and variations will be apparent to practitioners skilled in the art. Additionally, the above disclosure is not intended to limit the present description. The scope of the present description is defined by the appended claims.

What is claimed is:

1. A hybrid laser, comprising:
    a reflective gain medium (RGM) comprising an optical gain material coupled with an associated reflector;
    a silicon waveguide;
    a silicon mirror, which is optically coupled to the silicon waveguide;
    a spot-size converter (SSC) comprised of a SSC material, which optically couples the RGM to the silicon waveguide, wherein the SSC converts an optical mode-field size of the RGM to an optical mode-field size of the silicon waveguide;
    wherein the RGM, the spot-size converter, the silicon waveguide and the silicon mirror collectively form a lasing cavity for the hybrid laser;
    wherein an effective thermo-optic coefficient (TOC) of a portion of the lasing cavity that passes through the optical gain material and the SSC material is substantially the same as the TOC of silicon; and
    a laser output, which is optically coupled out of the lasing cavity.

2. The hybrid laser of claim 1, wherein the lasing cavity includes a length $l_{Si}$ through silicon, a length $l_{SSC}$ through the SSC material and a length $l_{OGM}$ through the optical gain material;
    wherein the effective refractive index of silicon is $n_{Si}$, the effective refractive index of the SSC material is $n_{SSC}$, and the effective refractive index of the optical gain material is $n_{OGM}$;
    wherein the effective TOC of silicon is $dn_{Si}/dT$, the effective TOC of the SSC material is $dn_{SSC}/dT$, and the effective TOC of the optical gain material is $dn_{OGM}/dT$; and
    wherein $l_{SSC} \approx l_{OGM} * (dn_{OGM}/dT - dn_{Si}/dT)/(dn_{Si}/dT - dn_{SSC}/dT)$, so that the effective TOC of the portion of the lasing cavity that passes through the optical gain material and the SSC material is substantially the same as the TOC of silicon.

3. The hybrid laser of claim 1, wherein the silicon mirror comprises a micro-ring mirror.

4. The hybrid laser of claim 1, wherein the silicon mirror comprises a distributed Bragg reflector (DBR).

5. The hybrid mirror of claim 1, wherein the silicon mirror is a tunable silicon mirror, which includes a thermal-tuning mechanism.

6. The hybrid laser of claim 1, wherein the RGM is located on a gain chip that is separate from a silicon photonic chip, which includes the silicon waveguide, and the silicon mirror.

7. The hybrid laser of claim 1, wherein the spot-size converter is comprised of silicon oxynitride (SiON), wherein the nitrogen-to-oxygen ratio may vary.

8. The hybrid laser of claim 1, wherein the spot-size converter is comprised of stoichiometric or low-stress silicon nitride (SiNx).

9. The hybrid laser of claim 1, wherein the optical gain material is comprised of a III-V semiconductor.

10. A system, comprising:
   at least one processor;
   at least one memory coupled to the at least one processor; and
   an optical transmitter for communicating optical signals generated by the system, wherein the optical transmitter includes a hybrid laser comprising:
      a reflective gain medium (RGM) comprising an optical gain material coupled with an associated reflector;
      a silicon waveguide;
      a silicon mirror, which is optically coupled to the silicon waveguide;
      a spot-size converter (SSC) comprised of a SSC material, which optically couples the RGM to the silicon waveguide, wherein the SSC converts an optical mode-field size of the RGM to an optical mode-field size of the silicon waveguide;
      wherein the RGM, the spot-size converter, the silicon waveguide and the silicon mirror collectively form a lasing cavity for the hybrid laser;
      wherein an effective thermo-optic coefficient (TOC) of a portion of the lasing cavity that passes through the optical gain material and the SSC material is substantially the same as the TOC of silicon; and
      a laser output, which is optically coupled out of the lasing cavity.

11. The system of claim 10, wherein the lasing cavity includes a length $l_{Si}$ through silicon, a length $l_{SSC}$ through the SSC material and a length $l_{OGM}$ through the optical gain material;
   wherein the effective refractive index of silicon is $n_{Si}$, the effective refractive index of the SSC material is $n_{SSC}$, and the effective refractive index of the optical gain material is $n_{OGM}$;
   wherein the effective TOC of silicon is $dn_{Si}/dT$, the effective TOC of the SSC material is $dn_{SSC}/dT$, and the effective TOC of the optical gain material is $dn_{OGM}/dT$; and
   wherein $l_{SSC} \approx l_{OGM}*(dn_{OGM}/dT - dn_{Si}/dT)/(dn_{Si}/dT - dn_{SSC}/dT)$, so that the effective TOC of the portion of the lasing cavity that passes through the optical gain material and the SSC material is substantially the same as the TOC of silicon.

12. The system of claim 10, wherein the silicon mirror comprises a micro-ring mirror.

13. The system of claim 10, wherein the silicon mirror comprises a distributed Bragg reflector (DBR).

14. The system of claim 10, wherein the silicon mirror is a tunable silicon mirror, which includes a thermal-tuning mechanism.

15. The system of claim 10, wherein the RGM is located on a gain chip that is separate from a silicon photonic chip, which includes the silicon waveguide, and the silicon mirror.

16. The system of claim 10, wherein the spot-size converter is comprised of silicon oxynitride (SiON), wherein the nitrogen-to-oxygen ratio may vary.

17. The system of claim 10, wherein the spot-size converter is comprised of stoichiometric or low-stress silicon nitride (SiNx).

18. The system of claim 10, wherein the optical gain material is comprised of a III-V semiconductor.

19. A method for operating a hybrid laser, comprising:
   generating an optical signal by powering a reflective gain medium (RGM) comprising an optical gain material coupled with an associated reflector;
   channeling the optical signal through a spot-size converter (SSC) and into a silicon waveguide, wherein the SSC converts an optical mode-field size of the RGM to an optical mode-field size of the silicon waveguide;
   channeling an optical signal from the silicon waveguide into a silicon mirror, which reflects the optical signal back to the RGM to form a lasing cavity; and
   optically coupling light from the lasing cavity, which comprises the RGM, the SSC, the optical waveguide, and the silicon mirror, into a laser output;
   wherein an effective thermo-optic coefficient (TOC) of a portion of the lasing cavity that passes through the optical gain material and the SSC material is substantially the same as the TOC of silicon.

20. The method of claim 19, wherein the lasing cavity includes a length $l_{Si}$ through silicon, a length $l_{SSC}$ through the SSC material and a length $l_{OGM}$ through the optical gain material;
   wherein the effective refractive index of silicon is $n_{Si}$, the effective refractive index of the SSC material is $n_{SSC}$, and the effective refractive index of the optical gain material is $n_{OGM}$;
   wherein the effective TOC of silicon is $dn_{Si}/dT$, the effective TOC of the SSC material is $dn_{SSC}/dT$, and the effective TOC of the optical gain material is $dn_{OGM}/dT$; and
   wherein $l_{SSC} \approx l_{OGM}*(dn_{OGM}/dT - n_{Si}/dT)/(dn_{Si}/dT - dn_{SSC}/dT)$, so that the effective TOC of the portion of the lasing cavity that passes through the optical gain material and the SSC material is substantially the same as the TOC of silicon.

* * * * *

UNITED STATES PATENT AND TRADEMARK OFFICE
CERTIFICATE OF CORRECTION

PATENT NO. : 9,871,346 B1
APPLICATION NO. : 15/425889
DATED : January 16, 2018
INVENTOR(S) : Lee et al.

Page 1 of 1

It is certified that error appears in the above-identified patent and that said Letters Patent is hereby corrected as shown below:

In the Specification

In Column 5, Lines 7-8, delete "($d\bar{n}_{III-V}/dT\sim2.4\sim10-4[1/K]$)" and insert --($d\bar{n}_{III-V}/dT \sim 2.4\times10-4[1/K]$)--, therefor.

In Column 5, Line 9, delete "($d\bar{n}_{SiNx}/dT\sim2.5\sim10-5[1/K]$)" and insert --($d\bar{n}_{SiNx}/dT \sim 2.5\times10-5[1/K]$)--, therefor.

In Column 5, Lines 10-11, delete "($d\bar{n}_{Si}/dT\sim1.86\sim10-4[1/K]$)." and insert --($d\bar{n}_{Si}/dT\sim1.86\times10-4[1/K]$).--, therefor.

In the Claims

In Column 10, Lines 48-49, in Claim 20, delete "$l_{SSC}\approx l_{OGM}*(dn_{OGM}/dT-n_{Si}/dT)/(dn_{Si}/dT-dn_{SSC}/dT)$," and insert --$l_{SSC}\approx l_{OGM}*(dn_{OGM}/dT - dn_{Si}/dT)/(dn_{Si}/dT - dn_{SSC}/dT)$,--, therefor.

Signed and Sealed this
Tenth Day of July, 2018

Andrei Iancu
*Director of the United States Patent and Trademark Office*